United States Patent [19]

Fliegel et al.

[11] Patent Number: 5,073,807
[45] Date of Patent: Dec. 17, 1991

[54] METHOD AND APPARATUS FOR ACHIEVING MULTIPLE ACOUSTIC CHARGE TRANSPORT DEVICE INPUT CONTACTS

[75] Inventors: Frederick M. Fliegel, Tempe; Frederick Y. Cho, Scottsdale; Fred S. Hickernell, Phoenix, all of Ariz.

[73] Assignee: Motorola, Inc., Schaumburg, Ill.

[21] Appl. No.: 562,497

[22] Filed: Aug. 2, 1990

[51] Int. Cl.$^5$ .............................. H01L 29/78
[52] U.S. Cl. ........................... 357/24; 357/26; 364/827; 377/60
[58] Field of Search ............ 357/24, 26, 15, 34; 364/827, 825, 862; 377/60

[56] References Cited

U.S. PATENT DOCUMENTS

| | | | |
|---|---|---|---|
| 4,085,441 | 4/1978 | Fagan | 364/827 |
| 4,231,810 | 11/1980 | Jantsch et al. | 357/24 |
| 4,369,378 | 1/1983 | Rockett, Jr. | 357/24 |
| 4,633,285 | 12/1986 | Hunsinger et al. | 357/24 LR |
| 4,799,244 | 1/1989 | Mikoshiba et al. | 357/24 |

Primary Examiner—Andrew J. James
Assistant Examiner—Sara W. Crane
Attorney, Agent, or Firm—Frank J. Bogacz; Eugene A. Parsons; Jordan C. Powell

[57] ABSTRACT

A bipolar injector structure, similar to a common-base amplifier circuit, is described for use as a unidirectional injector of charge for a charge-transfer device input circuit. This injector structure acts to reduce the input impedance of such devices. A plurality of bipolar injector structures may be implemented on a single ACT device channel, and electrically connected in parallel, to effect a further reduction of input impedance and a further increase in device dynamic range. By employing an input contact structure which allows charge to be injected at more than one point along the length of the channel, without perturbing charge which was injected at some earlier time, a means for forming a transversal filter function can be realized at the input contact structure in addition to that which is achieved at the output contact structure, thus permitting improved ACT device selectivity when operated as a filter. The plurality of bipolar injection structures form a transversal filter, allowing the overall ACT device to achieve out-of-band rejection and selectivity.

13 Claims, 2 Drawing Sheets

METHOD AND APPARATUS FOR ACHIEVING MULTIPLE ACOUSTIC CHARGE TRANSPORT DEVICE INPUT CONTACTS

BACKGROUND OF THE INVENTION

The present invention pertains to acoustic charge transport (ACT) devices and more particularly to an ACT device which improves device performance by reducing device insertion loss and achieving greater device selectivity when operated as a filter.

An ACT device employs a powerful UHF surface acoustic wave (SAW) propagating on the top, highly polished surface of a wafer of piezoelectric semiconductor material. The ACT bunches mobile charge carriers in the extrema of the SAW electrical potential and transports these discrete charge packets at the speed of sound through the semiconductor material. This process is described in detail in U.S. Pat. No. 4,633,285, entitled "Acoustic Charge Transport Device and Method", issued to Billy Jo Hunsinger and Michael Joseph Hoskins. The SAW thus functions similarly to the clocking signal in a conventional charge-coupled device (CCD), but without the complex interconnections which CCD's require.

A conventional ACT device will employ a single input ohmic contact for injecting charge carriers into the semiconducting channel of the ACT device. This results in very high input impedances to the ACT device relative to that of conventional wide-band 50 Ω systems. In turn, large insertion losses occur.

The use of a single input contact also places the full burden of achieving a filter transfer function on the output nondestructive sensing (NDS) array. As the charge packets travel beneath the NDS array, the charge packets in the channel are capacitively coupled to the NDS array elements. Samples of the channel charge packets are formed in the NDS without disturbing the charge packets in the channel. These samples are individually weighted by any of several means and then summed, forming a transversal filter structure.

A single input contact structure will only allow charge to be injected at one point along the length of the channel. This means that a transversal filter function cannot be realized at the input contact structure. The entire filter transfer function is achieved at the NDS output contact structure alone. Thus the overall device selectivity and ultimate out-of-band rejection of unwanted, interfering signals is limited to that which can be realized by the NDS output contact alone.

Accordingly, it is an object of the present invention to provide an acoustic charge transfer device which reduces the input impedance of input contact structures of the device and thereby reduces the insertion losses realized when such ACT device is operated in a conventional 50 Ω system.

It is a further object of the present invention to achieve improved filter selectivity and out-of-band rejection of interfering signals by the acoustic charge transfer devices, compared to the constraints imposed when filter functions are achieved by the NDS array alone.

SUMMARY OF THE INVENTION

A novel bipolar input contact structure which injects mobile charge carriers unidirectionally into an ACT channel can be operated as a common base amplifier circuit. As such, the structure can better match the impedance of the ACT input contact to typical system impedance levels. The bipolar input contact improves the ACT device dynamic range by minimizing impedance mismatch losses.

A plurality of bipolar injection structures may be implemented and electrically connected in parallel on a single ACT device channel to effect a further reduction of input impedance and increase the ACT device dynamic range. Such a structure has two functions. First, repeated injection of charge into the channel allows a transversal filter function to be implemented at the input contact. This augments the selectivity and ultimate out-of-band rejection of the overall ACT device transfer function. Second, in the filter function passband, the summation of a plurality of input signals provides an input contact structure having gain. Thus, the overall ACT device dynamic range and signal-to-noise ratio is improved.

The above and other objects, features, and advantages of the present invention will be better understood from the following detailed description taken in conjunction with the accompanying drawings.

DETAILED DESCRIPTION OF THE INVENTION

The teachings of U.S. Pat. No. 4,633,285 are hereby incorporated by reference.

In acoustic charge transport (ACT) technology, charge transport occurs in piezoelectric semiconductors (for example (100)-cut, <110>-propagating GaAs) when mobile charge is injected into, and trapped within the extrema of, a propagating electrical potential associated with a surface acoustic wave (SAW).

Figure 1:
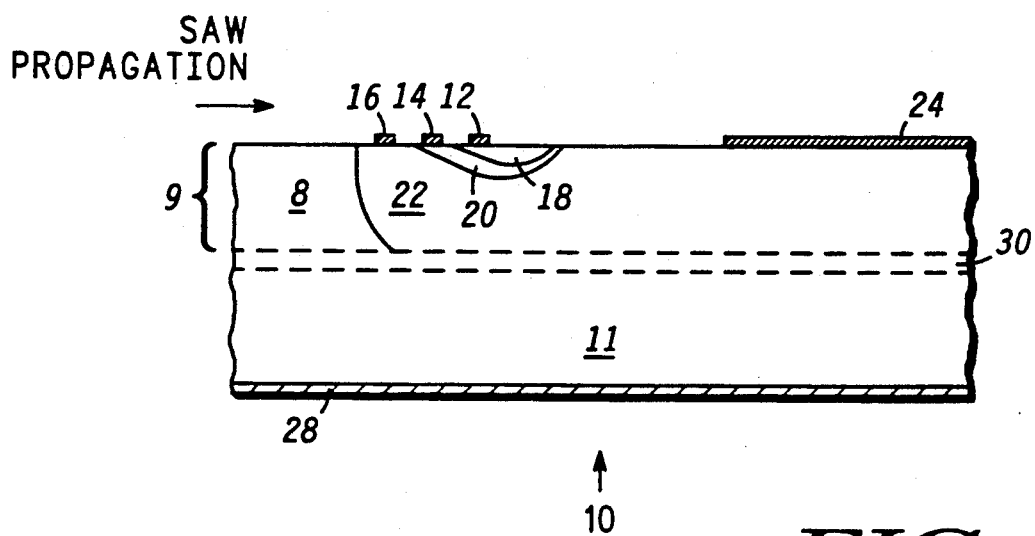
FIG. 1 is a cross-sectional longitudinal view of the input section of an ACT device channel employing a bipolar injector structure.

FIG. 1 shows a bipolar injector structure 10 generally comprising emitter contact 12, base contact 14, collector contact 16, Schottky contact 24, ACT channel 9, and substrate 11. Contacts 12, 14, and 16 are each input ohmic contacts, whereas Schottky contact 24 is an output. Contacts 12, 14, 16 and 24 are each coupled to the upper surface of ACT channel 9. ACT channel 9 is disposed on substrate 11.

ACT channel 9 comprises emitter region 18, base region 20, collector region 22, and proton bombarded region 8. As shown in FIG. 1, emitter region 18 is entirely separated from collector region 22 by base region 20. The direction of the propagation of the SAW as it travels through ACT channel 9 is from proton bombarded material 8 through regions 22, 20, and 18.

The upper portion of substrate 11 is p-type region 30. P-type region 30 forms a common extended boundary with ACT channel 9. An ohmic rear contact 28 is coupled to the bottom of substrate 11.

Emitter contact 12 is physically and electrically coupled to emitter region 18. Emitter region 18 is an ion implanted n-type semiconductor material. Similarly, base contact 14 is physically and electrically coupled to base region 20. Base region 20 is a p-type ion implanted semiconductor material. Collector contact 16 is physically and electrically coupled to collector region 22. Collector region 22 is an epitaxially grown n-type material.

In operation, contacts 12 and 14 are electrically biased such that contact 12 is more negative than contact 14. Accordingly, emitter region 18 is more negative than base region 20. The p-n junction between base region 20 and emitter region 18 is therefore forward biased.

Collector contact 16 is biased to be more positive than base contact 14. Accordingly, collector region 22 is more positive than base region 20. Collector region 22 and base region 20 form a reverse biased p-n junction. Electrons are injected into base region 20 from emitter region 18, where they are transported into the reverse biased p-n junction region between base region 20 and collector region 22. These carriers are swept from base region 20 into collector region 22 by fields associated with the reverse biased p-n junction.

ACT channel 9 and p-type region 30 form p-n junction 30 at their common boundary.

Once the charge carriers are injected into collector region 22, they are entrained within the minima of the propagating SAW potential, shown as traveling from left to right through ACT channel 9 in FIG. 1.

Figure 4:
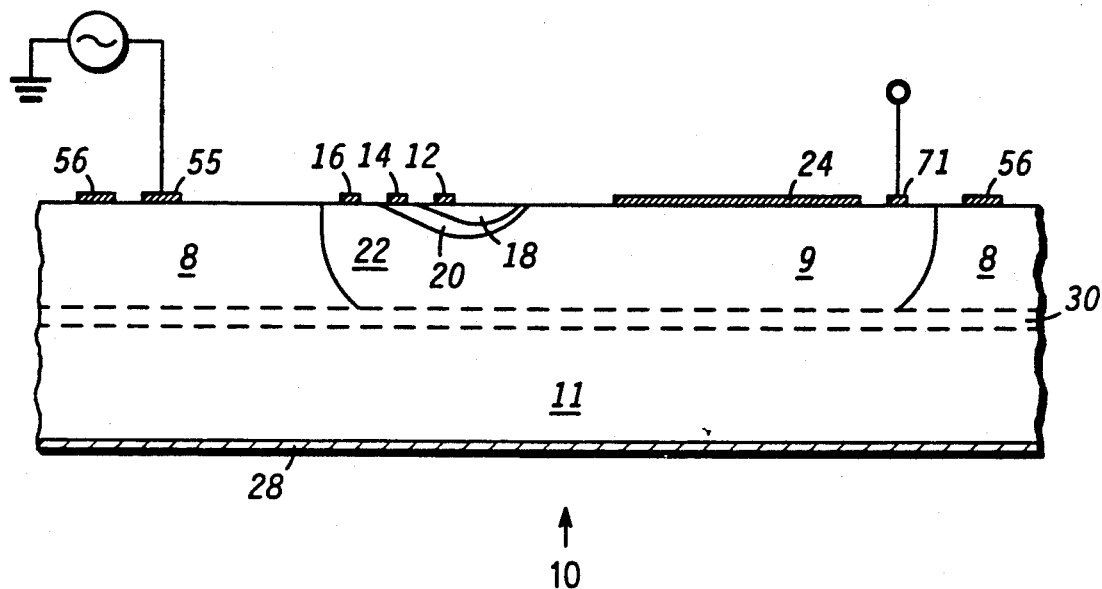
FIG. 4 is a cross-sectional view similar to FIG. 1 of a complete charge transfer device incorporating the structure of FIG. 1.
Figure 5:
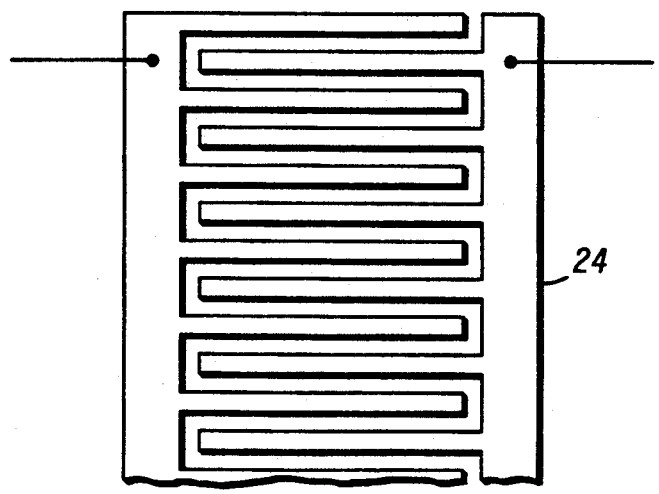
FIG. 5 is a view in top plan of the charge sensing apparatus of FIG. 4.

It will be recognized referring to FIG. 4, that the SAW is generated when a SAW transducer 55 is excited. The SAW transducer 55 is coupled to ACT channel 9 to transmit the SAW into ACT channel 9. Acoustic absorbers 56 are included to absorb surface acoustic waves introduced into ACT channel 9 by SAW transducer 55. A charge extraction electrode 71 is positioned on the surface of substrate 11 beyond charge sensing Schottky contact 24, in the direction of SAW propagation. Charge extraction electrode 71 removes charges introduced by the bipolar injector structure 12, 14, 16, after the charges are nondestructively sensed by Schottky contact 24. A view in top plan of a typical Schottky contact 24 is illustrated in FIG. 5. SAW transducer 55, acoustic absorbers 56 and extraction electrode 71, as well as the operation of nondestructive Schottky sensors, are described in more detail in the above referenced patent.

The number of carriers being injected into the SAW potential at any one time is proportional to the input signal magnitude applied to collector contact 12. A group of carriers injected at any single given time into the SAW potential minima is known as a charge packet.

The injected carriers cannot travel in the reverse direction, i.e., from collector region 22 to base region 20 or emitter region 18. This is due to the fields associated with the reverse biased p-n junction between the base 20 and collector 22 regions.

The charge packets are swept from left to right through collector region 22, by the SAW potential, underneath Schottky contact 24. Negative voltages relative to the voltage on collector contact 16 are applied to Schottky contact 24 and ohmic rear contact 28. These negative voltages deplete mobile charge carriers from the n-type epitaxial material of collector region 22 in the absence of a SAW.

Collector contact 16 establishes the reverse bias of Schottky contact 24 which depletes the mobile carriers in the upper half of collector region 22. Collector contact 16 also applies a reverse bias to the p-n junction at the common boundary of p-type region 30 and ACT channel 9. This reverse bias is required to deplete the lower half of the collector region 22 of mobile charge carriers in the absence of the SAW. The collector region 22 must be depleted of mobile charge carriers to avoid short-circuiting the electrical potential of the SAW.

The SAW impinging on collector region 22 is devoid of mobile charge carriers due to the absence of mobile carriers in proton bombarded region 8. Proton bombarded region 8 is depicted as being to the left of collector region 22 in FIG. 1. Proton bombarded region 8 is formed by bombarding collector region 22 with protons. The effect of the proton bombardment is to rupture inter-atomic bonds between gallium and arsenic atoms in collector material 22, resulting in spatially stationary electron trapping sites. These trapping sites are then occupied by electrons which would otherwise be mobile charge carriers in collector region 22. Thus, proton bombarded region 8 becomes semi-insulating and devoid of mobile charge carriers.

Figure 2:
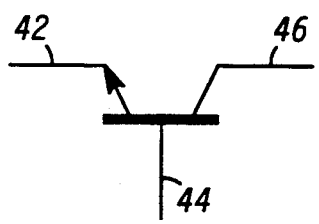
FIG. 2 is a schematic of an equivalent circuit for the bipolar injector structure.

The bipolar injector structure depicted in FIG. 1 is modeled by common base amplifier circuit 40 in FIG. 2. The transistor emitter 42 in FIG. 2 corresponds to contact 12 and emitter region 18 in FIG. 1. The transistor base 44 in FIG. 2 corresponds to contact 14 and base region 20 in FIG. 1. The transistor collector 46 in FIG. 2 corresponds to contact 16 and the collector region 22 in FIG. 1.

Common base amplifier circuit 40 in FIG. 2 exhibits less than unity current gain and effects a large impedance transformation. Specifically, circuit 40 demonstrates a low impedance at the emitter 42 side of the circuit and a high impedance at the collector 46 side of the circuit. The frequency response and the gain of circuit 40 are determined by the parasitic capacitance from collector 46 to ground and the parasitic collector resistance. Since collector 46 is in fact collector region 22 of FIG. 1, the parasitic collector capacitance from collector 46 and the parasitic collector resistance are minimized. Circuit 40 thus acts to substantially reduce the ACT device input impedance observed at emitter contact 12 in FIG. 1.

Figure 3:
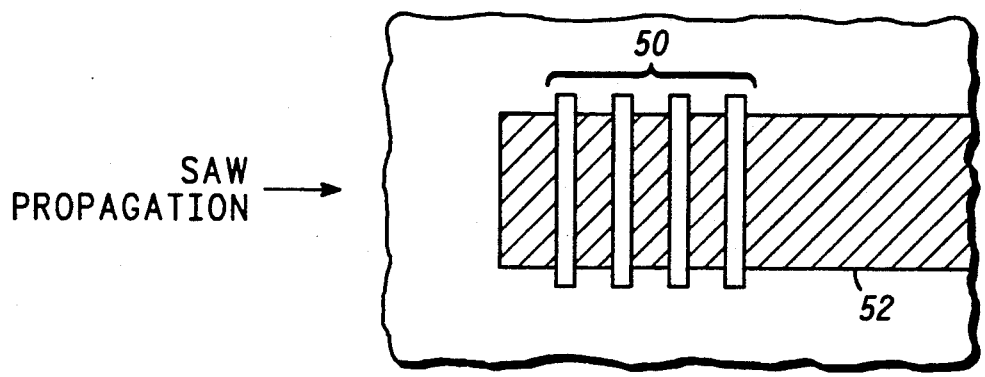
FIG. 3 is a top view of the input section of an ACT device channel employing a plurality of bipolar injector structures.

The unilateral injection process realized by bipolar injector 10 of FIG. 1 allows a plurality of injection structures 50 in FIG. 3 to be placed along some length of the ACT channel 52. Each of the injector structures 50 independently contributes a fraction of the total charge held in any one minimum of the SAW electrical potential. These contributions are made at different times due to the finite velocity of the SAW and the separation between the bipolar injector structures 50. Thus, bipolar input structures 50 comprise a transversal filter in forming their individual contributions to the overall charge packet magnitude. The frequency response of this transversal filter is determined by the spacings between, and the polarities and relative weights of, the individual bipolar injectors 50.

Placing the plurality of injector structures 50 along the length of channel 52 and electrically connecting the injector structures 50 in parallel further acts to reduce the magnitude of the ACT device input impedance. This configuration allows the effects of injection by each input structure to add together. This achieves gain and increases the dynamic range, decreasing the noise figure, of the ACT device.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A charge transfer device comprising:
    a substrate;
    channel means for transporting mobile charge, said channel means disposed on said substrate;
    a means for clocking said mobile charge through said channel in a predetermined direction, said means for clocking coupled to said channel means;
    charge injection means disposed on said channel means, said charge injection means for unidirectionally injecting said mobile charge into said channel means;
    charge sensing means disposed on said channel means, said charge sensing means for coupling an output to said mobile charge, said charge sensing means comprising a series of metallic electrodes forming Schottky barrier contacts with said channel means, said electrodes coupled to said channel means, said electrodes are configured such that SAW reflections from one set of electrode edges of said metallic electrodes cancel SAW reflections from another set of electrode edges; and
    charge extraction means coupled to said channel means, said charge extraction means for extracting said mobile charge from said channel means.

2. A charge transfer device as claimed in claim 1, wherein said clocking means comprises a SAW (surface acoustic wave) transducer coupled to said channel means.

3. A charge transfer device as claimed in claim 1, wherein said clocking means comprises a unidirectional SAW transducer coupled to said channel means.

4. A charge transfer device as claimed in claim 2, wherein said charge injection means is comprised of:
    a base region disposed on said channel means; and
    an emitter region disposed on said base region.

5. A charge transfer device as claimed in claim 4, wherein said base region and said emitter region are comprised of semiconductor materials doped by means of ion implantation and annealing of the implanted specie.

6. A charge transfer device as claimed in claim 4, wherein said base and said emitter regions are comprised of epitaxially grown and doped semiconductor materials.

7. A charge transfer device as claimed in claim 6, wherein the composition of said base region, said emitter region, and said channel means differ so as to form a heterojunction bipolar transistor structure.

8. A charge transfer device comprising:
    a substrate;
    channel means for transporting mobile charge, said channel means disposed on said substrate;
    a means for clocking said mobile charge through said channel in a predetermined direction, said means for clocking comprising a SAW (surface acoustic wave) transducer coupled to said channel means;
    charge injection means disposed on said channel means, said charge injection means for unidirectionally injecting said mobile charge into said channel means, said charge injection means further comprising;
        a base region disposed on said channel means, said base region comprising epitaxially grown and doped semiconductor materials;
        an emitter region disposed on said base region, said emitter region comprising epitaxially grown and doped semiconductor materials; and
        a heterojunction bipolar transistor injector structure, wherein the composition of said base region, said emitter region, and said channel means differ so as to form said heterojunction bipolar transistor injector structure; and
    charge sensing means disposed on said channel means, said charge sensing means for coupling an output to said mobile charge; and
    charge extraction means coupled to said channel means, said charge extraction means for extracting said mobile charge from said channel means.

9. A charge transfer device as claimed in claim 8, wherein said clocking means comprises a unidirectional SAW transducer coupled to said channel means.

10. A method for achieving a transversal filter function, comprising the steps of:
    providing a charge transfer device including a substrate with charge transfer channel in said substrate;
    calculating a desired filter function using a Fourier transform of relative positions and relative weights of bipolar injection structures; and
    applying a plurality of bipolar injection structures at the relative positions and of relative weights along the charge transfer channel.

11. A method for achieving a transversal filter function, comprising the steps of:
    providing a charge transfer device including a substrate, channel means for transporting mobile charge, said channel means disposed on said substrate, a means for clocking said mobile charge through said channel means in a predetermined direction, said means for clocking coupled to said channel means, charge sensing means disposed on said channel means for coupling an output to said mobile charge, and charge extraction means coupled to said channel means for extracting said mobile charge from said channel means;
    selecting a desired filter function requiring a plurality of bipolar injection structures;
    calculating the relative positions and relative weights of the bipolar injection structures using a Fourier transform of the filter function; and
    applying a plurality of bipolar injection structures at the calculated relative positions and with the calculated relative weights along said channel means.

12. A method for reducing the input impedance of charge transfer devices comprising the steps of:
    providing a charge transfer device including a substrate with a charge transfer channel in said substrate;
    providing a first unidirectional charge injection device including a base positioned in said substrate and having a base contact positioned on said substrate, an emitter positioned in said substrate and having an emitter contact positioned on said substrate and a collector positioned in said substrate and coupled to said charge transfer channel and having a collector contact positioned on said substrate, applying a bias to one of the emitter and the base contacts;

applying a bias to the collector contact; and applying an input signal to the other of the base and the emitter contacts.

13. A method for reducing the input impedance of charge transfer devices as claimed in claim 12, further comprising the step of:

providing a plurality of unidirectional charge injection devices similar to the first unidirectional charge injection device; and applying the input signal to the plurality of unidirectional charge injection devices distributed along some portion of the length of said charge transfer device channel.

* * * * *